United States Patent
Jeong et al.

(10) Patent No.: US 8,692,391 B2
(45) Date of Patent: Apr. 8, 2014

(54) EMBEDDED BALL GRID ARRAY SUBSTRATE AND MANUFACTURING METHOD THEREOF

(75) Inventors: Tae Sung Jeong, Gyunggi-do (KR); Doo Hwan Lee, Gyunggi-do (KR); Seung Eun Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/972,310

(22) Filed: Dec. 17, 2010

(65) Prior Publication Data

US 2012/0061833 A1 Mar. 15, 2012

(30) Foreign Application Priority Data

Sep. 10, 2010 (KR) .................. 10-2010-0089021

(51) Int. Cl.
- H01L 23/48 (2006.01)
- H01L 23/52 (2006.01)
- H01L 29/40 (2006.01)
- H05K 1/18 (2006.01)

(52) U.S. Cl.
USPC .......................................... 257/786; 361/764

(58) Field of Classification Search
USPC .............. 361/760, 764, 767, 768, 776, 783; 257/784, 786, 787
See application file for complete search history.

(56) References Cited

U.S. PATENT DOCUMENTS

| | | | |
|---|---|---|---|
| 5,432,677 A | 7/1995 | Mowatt et al. | |
| 5,729,050 A * | 3/1998 | Kim | 257/667 |
| 5,875,100 A | 2/1999 | Yamashita | |
| 6,271,469 B1 * | 8/2001 | Ma et al. | 174/521 |
| 6,876,554 B1 | 4/2005 | Inagaki et al. | |
| 6,964,887 B2 * | 11/2005 | Akagawa | 438/126 |
| 7,122,901 B2 | 10/2006 | Sunohara et al. | |
| 7,141,884 B2 | 11/2006 | Kojima et al. | |
| 7,550,843 B2 * | 6/2009 | Mihara | 257/734 |
| 7,653,991 B2 | 2/2010 | Mok et al. | |
| 7,755,910 B2 | 7/2010 | Mashino | |
| 7,886,433 B2 | 2/2011 | Bae et al. | |
| 2005/0062147 A1 * | 3/2005 | Wakisaka et al. | 257/712 |
| 2006/0237225 A1 * | 10/2006 | Kariya et al. | 174/260 |
| 2010/0006203 A1 | 1/2010 | Lee et al. | |
| 2010/0110638 A1 | 5/2010 | Yumoto et al. | |
| 2010/0134991 A1 | 6/2010 | Kim et al. | |
| 2011/0290546 A1 | 12/2011 | Lee et al. | |

FOREIGN PATENT DOCUMENTS

| | | |
|---|---|---|
| JP | 2002-246757 | 8/2002 |
| JP | 2004-071998 | 3/2004 |
| JP | 2005-14266 | 6/2005 |
| JP | 2005-159199 | 6/2005 |
| JP | 2005-216936 | 8/2005 |
| JP | 2006-049424 | 2/2006 |

(Continued)

*Primary Examiner* — Matthew Landau
*Assistant Examiner* — Priya Rampersaud
(74) *Attorney, Agent, or Firm* — Blakely, Sokoloff, Taylor & Zafman, LLP (57) ABSTRACT

Disclosed herein are an embedded ball grid array substrate and a manufacturing method thereof. The embedded ball grid array includes: a core layer having a cavity therein; a semiconductor device embedded in the cavity of the core layer; a first circuit layer having a circuit pattern including a wire bonding pad formed thereon; a second circuit layer having a circuit pattern including a solder ball pattern formed thereon; and a wire electrically connecting the semiconductor device to the wire bonding pad.

3 Claims, 5 Drawing Sheets

(56) References Cited

FOREIGN PATENT DOCUMENTS

| | | |
|---|---|---|
| JP | 2006-222334 | 8/2006 |
| JP | 2010-118373 | 5/2010 |
| KR | 1020060046308 A | 5/2006 |
| KR | 1020060049008 A | 5/2006 |
| KR | 1020070101183 A | 10/2007 |
| KR | 1020080046275 A | 5/2008 |
| KR | 1020080106977 A | 12/2008 |
| WO | WO2007/034629 A1 | 3/2007 |

* cited by examiner

Prior art

EMBEDDED BALL GRID ARRAY SUBSTRATE AND MANUFACTURING METHOD THEREOF

CROSS REFERENCE TO RELATED APPLICATION

This application claims the benefit of Korean Patent Application No. 10-2010-0089021, filed on Sep. 10, 2010, entitled "Embedded Ball Grid Array Substrate And Manufacturing Method Thereof" which is hereby incorporated by reference in its entirety into this application.

BACKGROUND OF THE INVENTION

1. Technical Field

The present invention relates to an embedded ball grid array substrate and a manufacturing method thereof.

2. Description of the Related Art

With the development of electronic industries, the integration of a semiconductor integrated circuit (IC) has been remarkably increased. Portable terminals in mobile communication fields serve only voice communication, short message transmission, etc., in the early stage. Recently, however, portable terminals have been increasingly expanded from basic communication functions, such as a game, data transmission, digital camera, music/moving picture file playing, or the like, to a multimedia service area.

Meanwhile, slimness and lightweight of a terminal are essentially demanded in consideration of portability of a portable terminal performing a mobile communication function.

There are a packaging technology in a ball grid array (BGA) scheme and a packaging technology in a land grid array (LGA) scheme in order to improve the integration of circuit devices.

The packaging technology in the BGA scheme is a technology that fuses solder balls to bond a chip, in which a semiconductor integrated circuit is molded, to a substrate. The fused solder balls are used as input and output terminals of the semiconductor integrated circuit. In this case, a technology of configuring the input and output terminals of the semiconductor integrated circuit as a solder pad provided on the substrate without fusing the solder balls is a packaging technology in an LGA scheme.

Figure 1:
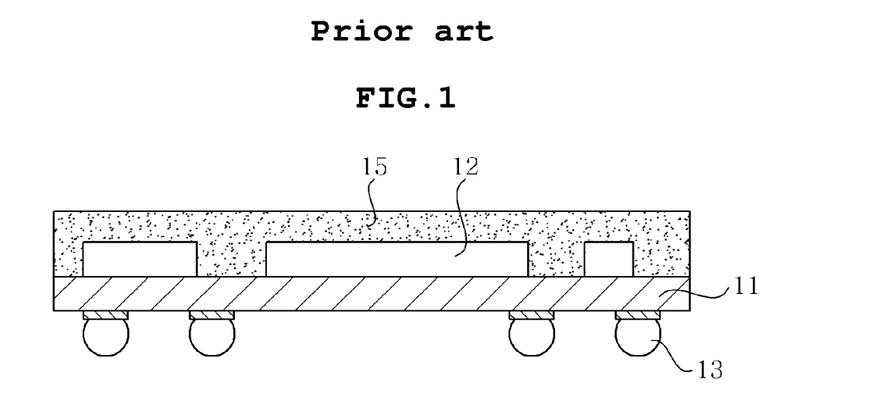
FIG. 1 shows a packaging scheme according to the prior art.

FIG. 1 shows a packaging scheme according to the prior art.

FIG. 1 is a cross-sectional view of a structure in which a resin is molded on the substrate and a packaging is made in the ball grid array scheme.

In this case, integrated circuits and passive devices 12 are mounted on a substrate 11 and a molding part 15 covering the passive devices is formed. The molding part 15 can serve to protect a mounting device 12 from external environments or effects and firmly fix the mounting device 12 on the substrate 11.

In this case, since the integrated circuits and the passive devices are mounted on one surface of the substrate, there is a limitation in reducing a volume.

SUMMARY OF THE INVENTION

The present invention has been made in an effort to provide an embedded ball grid array substrate capable of forming a cavity on a core layer and embedding a semiconductor chip in the formed cavity to reduce a thickness, and a manufacturing method thereof.

An embedded ball grid array substrate according to a preferred embodiment of the present invention includes: a core layer made of an insulating material and having a cavity therein; a semiconductor device embedded in the cavity of the core layer; a first circuit layer formed on one surface of the core layer and having a circuit pattern including a wire bonding pad formed thereon; a second circuit layer formed on the other surface of the core layer and having a circuit pattern including a solder ball pattern formed thereon; and a wire electrically connecting the semiconductor device to the wire bonding pad.

The embedded ball grid array substrate may further include a supporting layer made of an insulating material and fixing the semiconductor device by being formed to surround the semiconductor device.

The core layer may include: a first insulating layer having one surface contacting the first circuit layer and including a cavity therein to embed the semiconductor device in the formed cavity; and a second insulating layer made of an insulating material and having one surface contacting the first insulating layer and the other surface contacting the second circuit layer.

The embedded ball grid array substrate may further include a via hole penetrating through the core layer to electrically connect the first circuit layer to the second circuit layer.

The embedded ball grid array substrate may further include a first solder resist stacked on one surface of the first circuit layer; a second solder resist stacked on one surface of the second circuit layer; and a molding layer covering the first solder resist layer.

According to another preferred embodiment of the present invention, there is provided a manufacturing method of an embedded ball grid array substrate, including: (A) removing a copper clad of one surface of a first insulating layer, after preparing a copper cladded laminate formed with a copper clad at both sides of the first insulating layer and forming a cavity; (B) attaching a heat-resistant tape to an opposite surface to a surface from which the copper clad of the copper clad laminate is removed; (C) mounting a semiconductor device in a cavity of the copper clad laminate and stacking a second insulating layer and a copper clad on a surface from which the copper clad is removed; (D) forming a first circuit layer formed with a circuit pattern including a wire bonding pad at a copper clad contacting the first insulating layer and forming a circuit pattern including a solder ball pad at a copper clad contacting the second insulating layer; and (E) bonding and electrically connecting the semiconductor device to a wire bonding pad by a wire.

The manufacturing method of the embedded ball grid array substrate may further include after step (C), (F) forming a via hole penetrating through the first insulating layer and a second insulating layer.

The manufacturing method of the embedded ball grid array substrate may further include after step (D), (G) stacking a first solder resist on a first circuit layer and stacking a second solder resist on a second circuit layer; (H) forming holes at a position corresponding to the wire bonding pad of the first circuit layer at the first solder resist; and (I) forming holes at a position corresponding to the solder ball pad of the second circuit layer at the second solder resist.

At step (B), the heat-resistant tape may be a polyimide film.

Step (C) may include: (C-1) mounting the semiconductor device in the cavity of the copper clad laminate; (C-2) stacking the second insulating layer on a surface from which the copper clad is removed; (C-3) stacking the copper clad on the second insulating layer by using a carrier; and (C-4) removing the carrier.

Step (D) may include: (D-1) stacking a dry film on a copper clad contacting the first insulating layer and a copper clad contacting the second insulating layer; (D-2) forming a pattern corresponding to a circuit pattern of the first circuit layer including the wire bonding pad on the first dry film stacked on the copper clad contacting the first insulating layer and forming a pattern corresponding to a circuit pattern of the second circuit layer including the solder ball pad on the second dry film stacked on the copper clad contacting the second insulating layer; and (D-3) completing the first circuit layer and the second circuit layer formed with the circuit pattern including the wire bonding pad and the solder ball pad by etching the copper clad according to the pattern of the first dry film and the second dry film.

DESCRIPTION OF THE PREFERRED EMBODIMENTS

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, in describing the present invention, a detailed description of related known functions or configurations will be omitted so as not to obscure the gist of the present invention.

Hereinafter, a preferred embodiment of the present invention will be described in detail with reference to the accompanying drawings.

Figure 2:
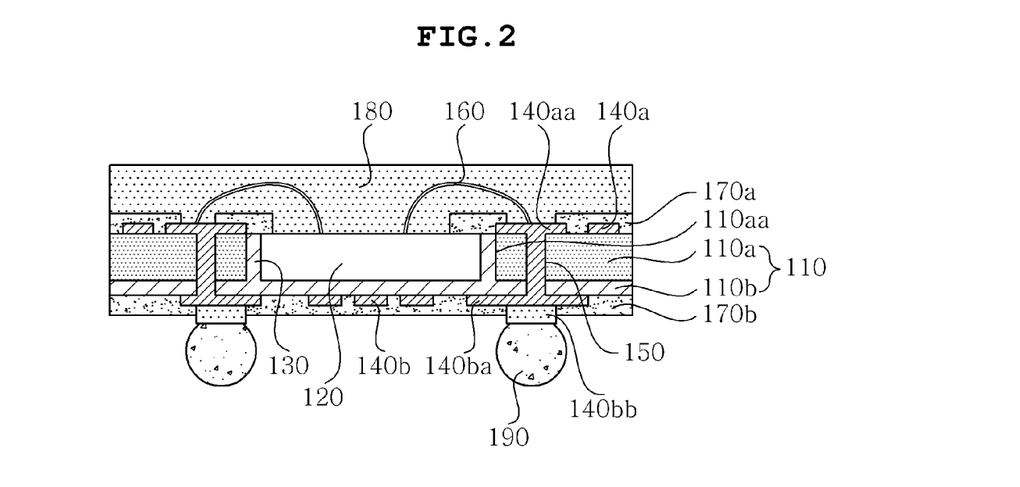
FIG. 2 is a structural diagram of an embedded ball grid array according to a first preferred embodiment of the present invention.

FIG. 2 is a structural diagram of an embedded ball grid array according to a first exemplary embodiment of the present invention.

Referring to FIG. 2, an embedded ball grid array substrate according to a first preferred embodiment of the present invention includes a core layer 110 made of an insulating material and having a cavity 110aa included therein, a semiconductor device 120 embedded in the cavity 110aa of the core layer 110, a supporting layer 130 made of an insulating material and fixing the semiconductor device 120 by being formed to surround the semiconductor device 120, a first circuit layer 140a formed on the upper portion of the core layer 110 and formed with a circuit pattern including a wire bonding pad 140aa, a second circuit layer 140b formed on the lower portion of the core layer 110 and formed with a circuit pattern including a solder ball pad 140ba, a via hole 150 electrically connecting the upper and lower portions of the core layer 110, a first solder resist layer 170a stacked on the upper portion of the first circuit layer 140a, a second solder resist layer 170b stacked on the lower portion of the second circuit layer 140a, and a molding layer 180 covering the first solder resist layer 170a.

In this configuration, the core layer 110 is configured to include two insulating layers 110a and 110b made of an insulating material.

The first insulating layer 110a has one surface contacting the first circuit layer 140a and includes a cavity 110aa therein, wherein the cavity 110aa has the semiconductor device 120 therein.

The second insulating layer 110b is made of an insulating material and has one surface contacting the first insulating layer 110a and the other surface contacting the second circuit layer 140b.

The first insulating layer 110a and the second insulating layer 110b may be made of the same material or may be formed of different materials.

Meanwhile, one surface of the core layer 110 is provided with solder balls 190 arranged in an array shape, wherein the solder balls are connected to the solder ball pad 140ba. It is mounted on a motherboard (not shown) through the solder ball 190.

When the solder balls 190 are connected to the solder ball pad 140ba, they may be connected to the solder ball pad 140ba, having an Ni/Au plating layer 140bb therebetween.

Next, an example of the semiconductor device 120 mounted on the core layer 110 may include a transistor, a diode, an IC chip, or the like.

The semiconductor device 120 is connected to the wire bonding pad 140aa of the first circuit layer 140a formed on the upper portion of the core layer 110 through the wire 160.

The supporting layer 130 is formed to surround the semiconductor device 120. In this case, the supporting layer 130 may be made of the same material as an insulating material of the second insulating layer 110b.

The solder resist layers 170a and 170b are stacked on the first circuit layer 140a or the second circuit layer 140b and are provided with a window for the wire bonding pad 140aa or the solder ball pad 140ba.

Next, the molding layer 180 has the solder resist layer 170a formed on the upper portion thereof to serve to protect the semiconductor device 120 from external environments or effects and firmly fixes the semiconductor device 120 to the core layer 110.

As long as the material of the molding layer 180 is softened by heating, any materials may be used. As an example of a material of the molding layer 180, melamine derivatives, such as epoxy resin, BT resin, or the like, liquid crystal polymer, PPE resin, polyimide resin, fluororesin, phenol resin, polyamide bismaleimide, etc., may be used. In addition, the molding layer 180 may include a filling agent, such as filler or fiber, or the like.

Meanwhile, the ball grid array substrate according to a first exemplary of the present invention has only the circuit layer 140a on the upper portion of the core layer 110, but may be configured to include a plurality of circuit layers by consecutively stacking the insulating layer and the circuit layer.

FIGS. 3 to 16 are process diagrams showing a manufacturing method of an embedded ball grid array substrate according to the first exemplary embodiment of the present invention.

Figure 3:
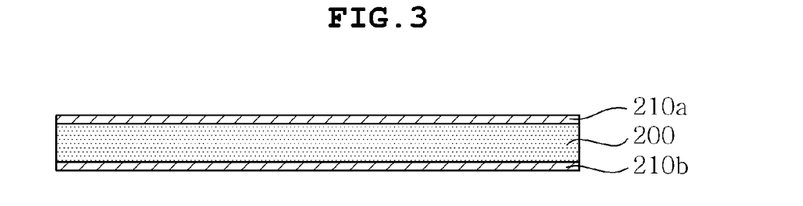
FIGS. 3 to 16 are cross-sectional views showing a manufacturing method of an embedded ball grid array substrate according to the first preferred embodiment of the present invention.

Referring to FIG. 3, in the embedded ball grid array substrate according to the first preferred embodiment of the present invention, a copper cladded laminate (CCL) in which copper clads 210a and 210b are stacked on a first insulating layer 200 is prepared.

In this case, there are various kinds of copper cladded laminates, such as glass/epoxy copper cladded laminate, heat-resistant resin copper cladded laminate, paper/phenol copper cladded laminate, high-frequency copper cladded laminate, flexible copper cladded laminate (polyimide film), and composite copper cladded laminate, or the like. Among others, the glass/epoxy copper cladded laminate is mainly used to manufacture a both-side printed circuit board and a multi-layer printed circuit board.

Figure 4:
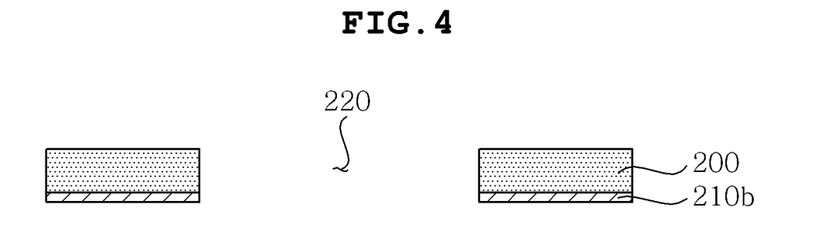

As shown in FIG. 4, a cavity 220 is formed in the first insulating layer 200 and a copper clad (herein, upper copper clad 210a) of any one side is removed. In this case, a method of forming the cavity 220 may be formed by a punching or drill bit.

Figure 5:
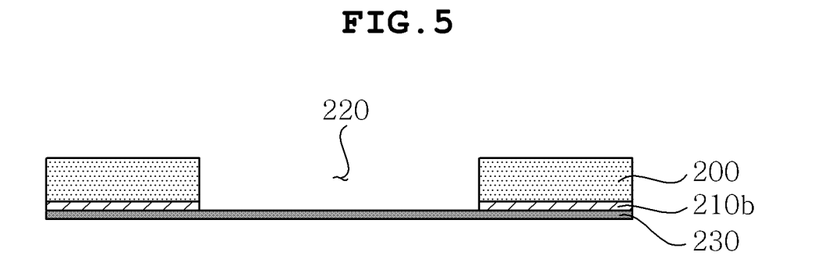

Thereafter, as shown in FIG. 5, a heat-resistant tape 230 is stacked on one surface of the first insulating layer 200 formed with the cavity 220. Herein, the heat-resistant tape 230 may use several materials insensitive to heat, preferably, a polyimide film.

Figure 6:
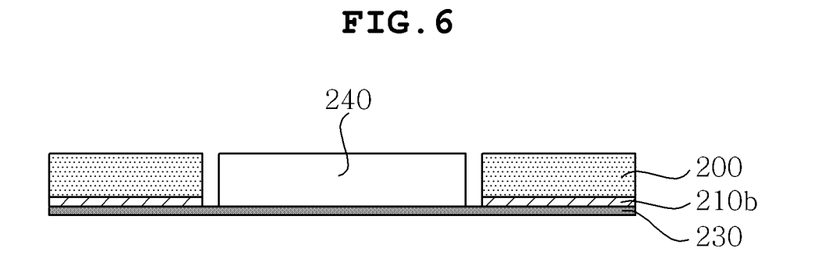

Next, as shown in FIG. 6, the semiconductor device 240 is mounted in the cavity 220. In this case, the semiconductor device 240 is mounted so that the wire bonding pad formed on a surface contacting the heat-resistant tape 230 of the first insulating layer 200 and the wired bonding pad of the semiconductor device 240 electrically connectable to each other by the wire face the heat-resistant tape 230 in the subsequent process.

Figure 7:
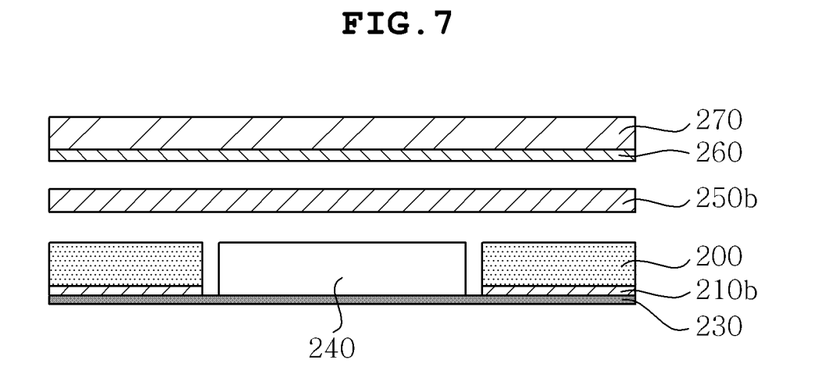
Figure 8:
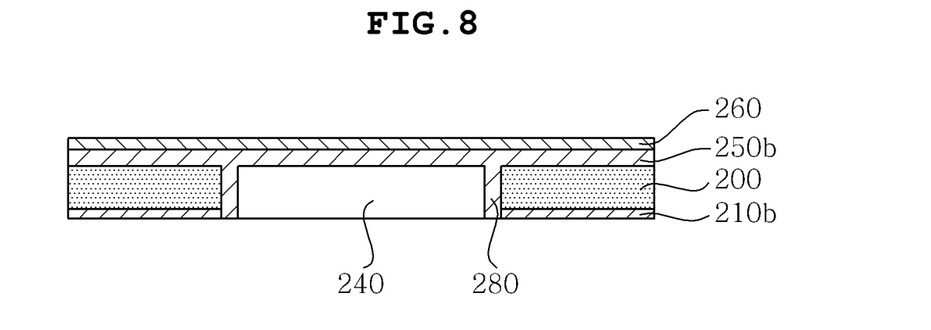

As shown in FIG. 7, the second insulating layer 250b is stacked to cover the semiconductor device 240 and a copper clad 260 is stacked thereon, which is in turn compressed as shown in FIG. 8.

In this case, the second insulating layer 250b may be a prepreg and when the second insulating layer 250b is stacked to cover the semiconductor device 240, a gap between the semiconductor device 240 and the cavity 220 is filled with the second insulating layer 250b to form a supporting layer 280 as can be appreciated from FIG. 8.

The copper clad 260 uses a carrier 270 when being stacked in the second insulating layer 250b, such that it may be stacked in the second insulating layer 250b. In this case, the carrier 270 is removed after the copper clad 260 is stacked in the second insulating layer 250b. In this case, two insulating layers, i.e., insulating layers denoted by reference numerals 200 and 250b form the core layer in the present invention.

Subsequently, the heat-resistant tape 230 is removed and the copper clad 210b is exposed on a surface from which the heat-resistant tape 230 is removed.

Figure 9:
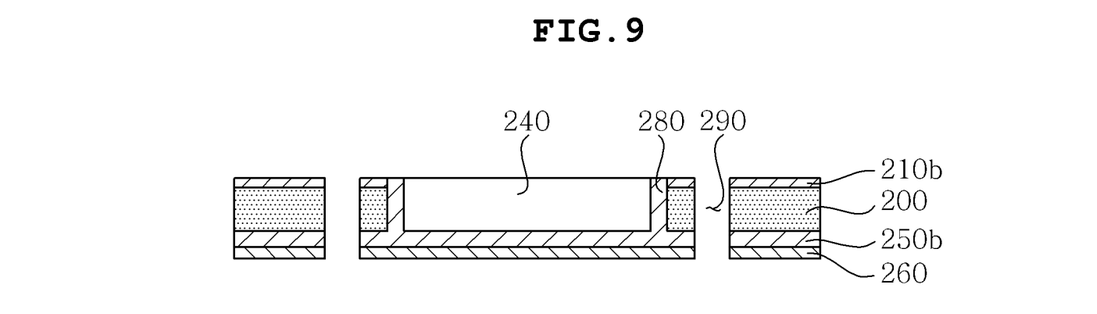

Next, as shown in FIG. 9, in order to form the via hole electrically connecting the upper and lower surfaces of the insulating layers 200 and 250b, a through hole 290 is formed by being machined.

In this case, a process of forming the through hole may use a scheme that forms a through hole along a previously set position by using a computer numerical control (CNC) drill or a laser drill.

Meanwhile, after forming the through hole 290, it is preferable to perform a desmear process that melts the insulating layers 200 and 250b, etc., due to heat generated at the time of forming the through hole 290 to remove smear generated from a side wall of the through hole 290.

Figure 10:
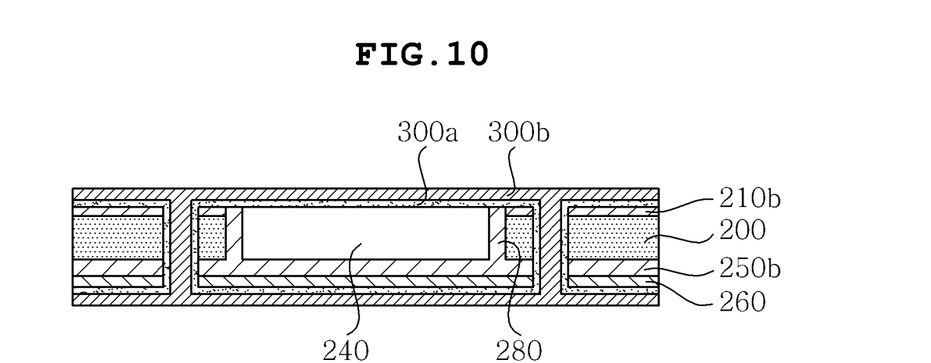

Thereafter, as shown in FIG. 10, the surfaces of the insulating layers 200 and 250b and the inner wall of the through hole 290 are provided with copper plating layers 300a and 300b electrically connected to each other by an electroless plating and an electroplating.

In this case, since the side wall of the through hole 290 of the insulating layers 200 and 250b is made of an insulating material, an copper electroplating cannot be performed immediately after the through hole 290 is formed.

Therefore, the electroless copper plating is performed in order to perform the electrical connection and electro copper plating of the formed through hole 290, thereby forming a copper electroplating layer 300a. After the electroless copper plating is completed, a copper electroplating layer 300b is formed by performing the copper electroplating using a direct current rectifier after dipping the insulating layers 200 and 250b in a copper plating container.

It is preferable that the copper electroplating uses a scheme of precipitating copper with current suitable for the direct current rectifier by calculating an area to be plated.

It is advantageous in that the copper electroplating has more excellent physical characteristics than the electroless copper plating layer and more easily forms the thick copper plating layer.

Figure 11:
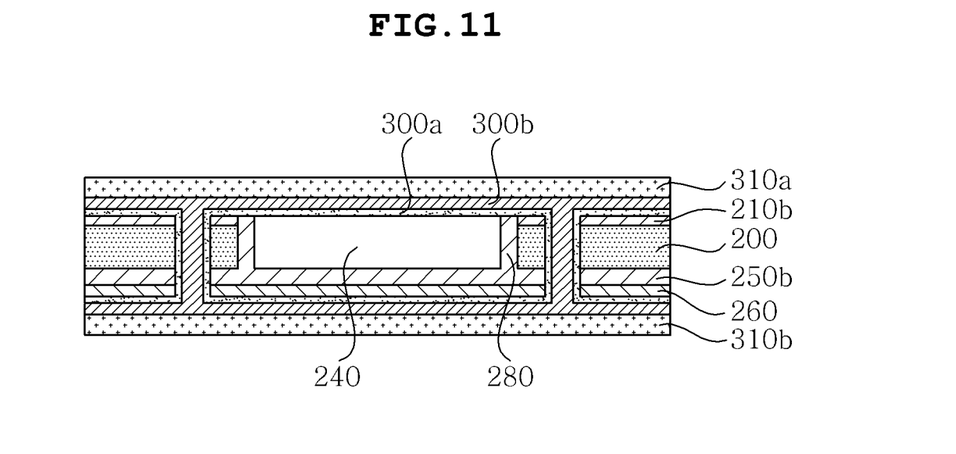

Next, as shown in FIG. 11, dry films 310a and 310b are each applied to the upper and lower copper plating layers 300a and 300b of the insulating layers 200 and 250b.

In this case, the dry films 310a and 310b are formed of three layers, that is, a cover film, a photo-resist film, and a mylar-film, wherein the photo-resist film substantially serves as a resist.

Figure 12:
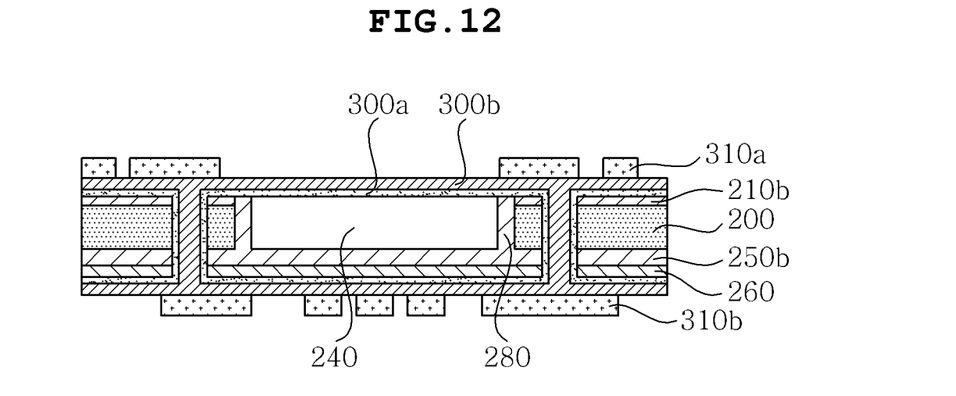

Next, as shown in HG. 12, a predetermined pattern is formed on the dry films 310a and 310b by exposing and developing the dry films 310a and 310b on which a predetermined pattern is printed. In this case, the predetermined pattern includes a circuit pattern, a land of a via hole E, a wire bonding pad pattern, and a solder ball pad pattern.

The exposure and development process of the dry films 310a and 310b adhere an art work film, on which a predetermined pattern is printed, to the dry films 310a and 310b and then irradiate ultraviolet rays. In this case, ultraviolet rays do not transmit a black portion in which the art work film pattern is printed and ultraviolet rays transmit a non-printed portion, thereby curing the dry film under the art work film. If the insulating layers 200 and 250b on which the dry films 310a and 310b are cured is dipped in the developer, a portion in which the dry films 310a and 310b are not cured is removed by the developer and a portion in which the dry films 310a and 310b are cured remains, thereby forming the etching resist pattern.

Figure 13:
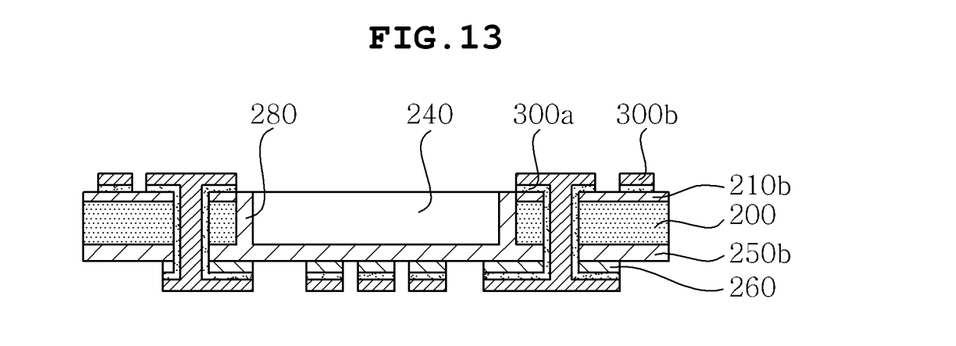

As shown in FIG. 13, the upper and lower copper dads 210b and 260 and the copper plating layers 300a and 300b in a portion other than a portion corresponding to a predetermined pattern of the dry films 310a and 310b are removed through etching by using the dry films 310a and 310b formed with the predetermined pattern as an etching resist and spraying an etchant to the insulating layers 200 and 250b.

Figure 14:
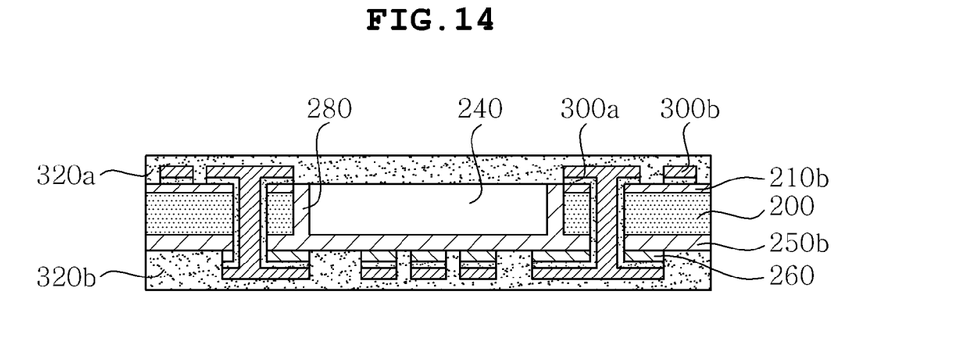
Figure 15:
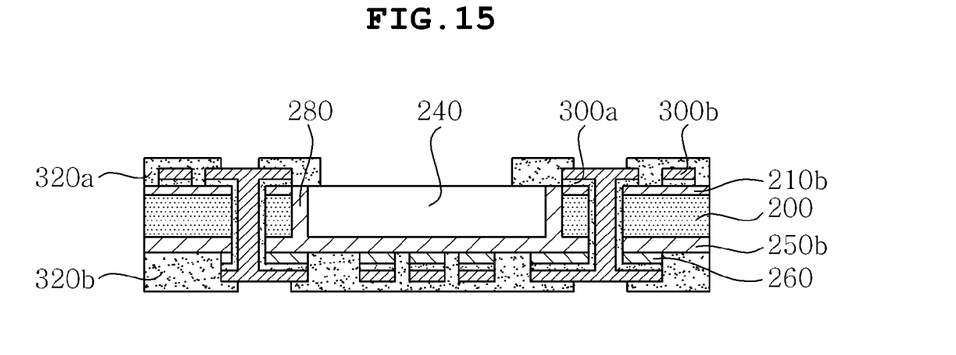

Thereafter, as shown in FIG. 14, the dry films 310a and 310b applied to both surfaces of the upper and lower portions of the insulating layers 200 and 250b are removed by a peeling off process and the solder resists 320a and 320b are applied and then pseudo-dried.

In this case, the dry films 310a and 310b are removed by using a stripper including sodium hydroxide (NaOH) or potassium hydroxide (KOH), or the like.

In the process of FIGS. 11 to 14 as described above, the dry films 310a and 310b are used as the etching resist but may use a liquid-state photosensitive material as the etching resist.

In this case, the liquid-state photosensitive material photosensitized by ultraviolet rays is applied to the copper plating layers 300a and 300b of the insulating layers 200 and 250b and is dried. Subsequently, the photosensitive material is exposed and developed by using the art work film on which a predetermined pattern is formed, thereby forming a predetermined pattern on the photosensitive material.

Next, the upper and lower copper dads 210b and 260 and the copper plating layers 300a and 300b in a portion other than a portion corresponding to a predetermined pattern of the photosensitive material are removed through etching by using the photosensitive material formed with the predetermined pattern as an etching resist and spraying an etchant to the insulating layers 200 and 250b. Thereafter, the photosensitive material is removed. In this case, as the method of coating the liquid-state photosensitive material, there are a dip coating method, a roll coating method, an electro-deposition method, or the like.

The method of using the liquid-state photosensitive material may apply thinner than the dry films 310a and 310b, thereby making it possible to form more finely circuit patterns. In addition, when there are rugged portions on the insulating layers 200 and 250b, the photosensitive material may fill the rugged portions to make the surface thereof uniform.

Meanwhile, the problem where the solder resists 320a and 320b and the copper plating layer 300b are not completely adhered to each other may be caused.

Therefore, before the solder resists 320a and 320b are applied, it is preferable to wash the surface of the substrate and perform pretreatment giving roughness on the surface of the substrate in order to improve the adhesion between the solder resists 320a and 320b and the copper plating layer 300b.

As a method of applying the solder resists 320a and 320b, a screen printing method, a roller coating method, a curtain coating method, a spray coating method, etc., may be used.

In this case, the screen printing method is a method of directly printing the solder resist pattern and the roller coating method is a method of applying solder resist ink, which has lower viscosity than that used in the screen printing method, to a roller made of rubber and coating it on the substrate.

In addition, the curtain coating method is a method of using the solder resist ink having viscosity lower than that used in the roller coating method and the spray coating method is a method of spraying and coating the resist ink.

Next, after the art work film, on which the solder resist pattern is printed, is adhered to the upper and lower solder resists 320a and 320b, the solder resists 320a and 320b are exposed and developed, thereby curing the solder resists 320a and 320b corresponding to the solder resist pattern.

In this case, ultraviolet rays do not transmit the black portion in which the solder resist pattern of the art work film is printed during the exposure process and transmit the non-printed portion, thereby curing the solder resists 320a and 320b.

Thereafter, after the art work film is removed, the solder resists 320a and 320b in the non-cured portion are removed during the development process, thereby forming the solder resist pattern.

Thereafter, the UV-curing is made by irradiating ultraviolet rays and the solder resists 320a and 320b are completely cured by using the dryer (not shown).

In the case, it is preferable to further perform a process of removing the residuals, foreign materials, etc., of the solder resists 320a and 320b remaining in the portion, in which the solder resists 320a and 320b are removed, by plasma, or the like.

Figure 16:
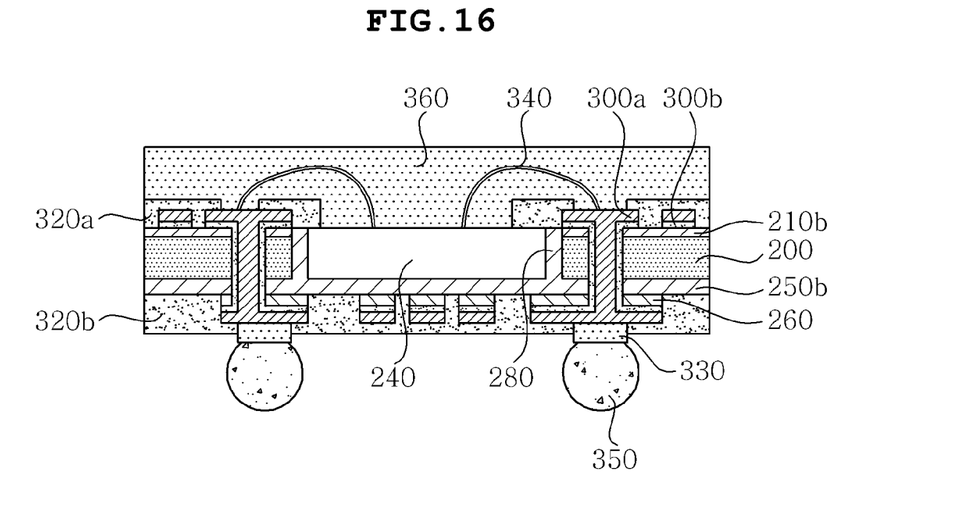

Next, as shown in FIG. 16, a Ni/Au plating layer 330 is formed in the solder ball pad pattern.

Next, the semiconductor device 240 and the wire bonding pad are bonded and electrically connected to each other by using the wire 340, the solder ball 350 is formed, and the molding 360 is then made, thereby forming the ball gray array substrate.

According to the present invention, the connection state of the embedded components can be checked by the naked eye by connecting between the semiconductor devices and the wire bonding pads by the wire, thereby making it possible to increase the connection reliability.

In addition, according to the present invention, the fine circuit pattern can be formed by connecting between the semiconductor devices and the bonding pads by the wire.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. An embedded ball grid array substrate, comprising:
    a core layer made of an insulating material and having a cavity therein;
    a semiconductor device embedded in the cavity of the core layer;
    a first circuit layer formed on one surface of the core layer and having a first circuit pattern including a wire bonding pad formed thereon;
    a second circuit layer formed on another surface of the core layer and having a second circuit pattern including a solder ball pattern formed thereon;
    a wire electrically connecting the semiconductor device to the wire bonding pad; and,
    a supporting layer made of an insulating material and fixing the semiconductor device by being formed at a gap between the semiconductor device and the core layer to surround the semiconductor device,
    wherein the core layer includes:
    a first insulating layer having the one surface contacting the first circuit layer and including the cavity therein to embed the semiconductor device in the formed cavity; and a second insulating layer made of the insulating material and having one surface contacting the first insulating layer and another surface contacting the second circuit layer;
    the supporting layer is integrated with the core layer and is made of the same material with the insulating material of the core layer;
    the second insulating layer is directly contacting the first insulating layer; and
    the one surface of the semiconductor device has the same height with the one surface of the first insulating layer.

2. The embedded ball grid array substrate as set forth in claim 1, further comprising a via hole penetrating through the core layer to electrically connect the first circuit layer to the second circuit layer.

3. The embedded ball grid array substrate as set forth in claim 1, further comprising:
   a first solder resist stacked on the one surface of the first circuit layer;
   a second solder resist stacked on the one surface of the second circuit layer; and
   a molding layer covering the first solder resist layer.

\* \* \* \* \*